HIGH IMPEDANCE GALVANOMETER WITH AMPLIFIER INPUT

Filed Oct. 23, 1967

7 Sheets-Sheet 1

HIGH IMPEDANCE GALVANOMETER WITH AMPLIFIER INPUT

Filed Oct. 23, 1967 7 Sheets-Sheet 2

INVENTORS.
RICHARD M. CANZONERI
ROBERT L. CHENEY
ERNEST H. OTTO
BY Christie, Parker & Hale
ATTORNEYS INVENTORS.
RICHARD M. CANZONERI
ROBERT L. CHENEY
ERNEST H. OTTO
BY Christie, Parker & Hale
ATTORNEYS INVENTORS.
RICHARD M. CANZONERI
ROBERT L. CHENEY
ERNEST H. OTTO
BY Christie, Parker & Hale
ATTORNEYS INVENTORS.
RICHARD M. CANZONERI
ROBERT L. CHENEY
ERNEST H. OTTO
BY Christie, Parker & Hale
ATTORNEYS INVENTORS.
RICHARD M. CANZONERI
ROBERT L. CHENEY
ERNEST H. OTTO
BY Christie, Parker & Hale
ATTORNEYS INVENTORS.
RICHARD M. CANZONERI
ROBERT L. CHENEY
ERNEST H. OTTO
BY Christie, Parker & Hale
ATTORNEYS United States Patent Office 3,509,459
Patented Apr. 28, 1970

3,509,459
HIGH IMPEDANCE GALVANOMETER WITH AMPLIFIER INPUT

Richard M. Canzoneri and Robert L. Cheney, Arcadia, and Ernest H. Otto, Temple City, Calif., assignors, by mesne assignments, to Bell & Howell Company, Chicago, Ill., a corporation of Illinois Filed Oct. 23, 1967, Ser. No. 677,186
Int. Cl. G01r *13/38, 1/30, 1/14*
U.S. Cl. 324—97 28 Claims

ABSTRACT OF THE DISCLOSURE

A galvanometer for a record oscillograph in which an amplifier is provided between galvanometer signal input terminal means and a deflection coil of a glavanometer movement located within a housing of the galvanometer. The amplifier output impendance corresponds to a desired damping impendance for the galvanometer movement. The amplifier input impendance is sufficiently high that a signal generator coupled to the galvanometer input terminal means during use of the galvanometer produces essentially a voltage signal. The amplifier produces a current proportional in value to the value of a signal applied to the input terminal means. The amplifier and galvanometer movement are matched to each other.

FIELD OF THE INVENTION

This invention relates to oscillography and, more particularly, in recording oscillography, to a galvanometer having a high input impedance.

BACKGROUND OF THE INVENTION

Description of the prior art

An oscillograph is an instrument which receives a variable electrical input signal and which produces a graphic representation of the variations in value of the input signal. An optical oscillograph conventionally uses a galvanometer incorporating a mirror mounted for movement with a deflection coil to which the oscillograph input signals are applied. A light beam is reflected by the mirror to a moving photosensitive medium. As the oscillograph input signal varies in value, the mirror is deflected to produce movement of the reflected light beam across the moving photosensitive medium, thereby to produce, upon development of the latent image produced in the medium, a graphic representation of the variation with time of the value of the input signal.

Prior galvanometers for optical oscillography had low input impedance, i.e., for proper damping of the galvanometer movement, such galvanometers had to be used with an energizing device having a relatively low impedance not exceeding, say, 2,000 ohms for fluid damped galvanometers and 350 ohms, say, for magnetically damped galvanometers. Such galvanometers have been coupled directly to low output impendance transducers (devices which produce an electrical signal indicative of the value of a pecific physical phenomenon, such as acceleration) such as strain gage transducers which, when coupled to the galvanometer, provided the proper galvanometer damping impedance. It has been standard practice to provide .64 damping factor for the galvanometer to provide as broad a usable frequency range as possible, in order that the curve of signal phase shift with signal frequency may be linear in the usable frequency range of the galvanometer movement, and to provide an acceptable galvanometer response to step-function input signals.

Also, it has been true that the transducer, particularly strain gage transducers, function as a current generator relative to the galvanometer when coupled directly to the galvanometer. This is convenient since the galvanometer is a current-sensitive device.

Where it was desired to use the galvanometer with a transducer, such as a piezoelectric transducer, having an output impedance substantially different from the desired galvanometer damping impedance, it was necessary to install at least an impedance matching network between the transducer and the galvanometer. Often an amplifier was also required in the line between the transducer and the galvanometer to amplify the very low output current of the transducer to the level required to drive the galvanometer with the desired full range deflection, especially where the galvanometer was called upon to respond to high frequency input signals. In these arrangements, the transducer functioned basically as a current generator or a charge generator.

The arrangements described above, however, have drawbacks because the current conductors between the galvanometer and the transducer, whether or not an amplifier is used, must be specially shielded to prevent signal degradation by reason of stray currents and fields in the area of the transducer and between the galvanometer and the transducer. Such shielded conductors are expensive. The need for the use of special shielded conductors exists wherever the signal applied to the galvanometer is a current or charge signal rather than a voltage signal.

To minimize the problems decribed above, it is known to couple the transducer to such a high impedance load that the transducer appears to be looking at an open circuit, in which case the signal developed by the transducer is a voltage since the current flow through the transducer is negligible. In such arrangements, shielded conductors can be replaced by simple coaxial conductors. In terms of the galvanometer, however, the arrangement is not satisfactory in and of itself since the galvanometer is a current-sensitive, low impedance device and impedance matching networks producing the proper damping impedance for the galvanometer are still required to match the high load impedance of the transducer to the impedance which the galvanometer perfers to see for its proper damping characteristics; also, amplifiers are necessary to deliver enough current to the galvanometer to produce the desired full scale deflection of the galvanometer.

SUMMARY OF THE INVENTION

This invention provides a novel, effective, efficient and economical solution to the competing and previously unresolvable considerations reviewed above. The invention provides, preferably within the galvanometer itself, an amplifier which is matched, preferably permanently, to the galvanometer movement and which has a high input impedance and a low output impedance. The high input impedance means that the galvanometer-amplifier combination can be coupled directly to a transducer to cause the transducer to operate as a voltage generator. The low output impedance of the amplifier relative to the galvanometer movement means that the galvanometer movement has the appropriate damping impendance applied to it. The amplifier receives a voltage as an input and provides a current of selected level as an output.

The feature that the galvancmeter itself incorporates the amplifier has several significant advantages. First, the galvanometer appears to be a high impedance, voltage-oriented device.

Second, the permanent marriage of the galvanometer movement and the amplifier means that the rated sensitivity (inches of movement of a reflected light beam at a defined distance from the mirror per millivolt of signal applied to the galvanometer input terminals) of the galvanometer can be obtained and maintained easily and economically by a simple adjustment of the amplifier. If the sensitive tolerance of the galvanometer per se is to be plus or minus 5%, and such accuracy is to be maintained in the galvanometer-amplifier combination where the amplifier is separated from the galvanometer, the amplifiers would all have to be accurate to within plus or minus 2½%, say, and the galvanometers would also have to be accurate to within plus or minus 2½%; this is the case if any amplifier can be used with any galvanometer. It is expensive and difficult to provide any appreciable number of amplifiers and galvanometers with such rated accuracies and sensitivity tolerances. Alternatively, a particular amplifier can be matched with a particular galvanometer to produce an amplifier-galvanometer combination which has the desired overall sensitivity tolerance. This practice, however, requires that the user of the galvanometer take care at all times to use the specific proper amplifier with the specific proper galvanometer if he is to obtain the desired accuracy in the final graphic recording. Obviously, this solution presents severe logistics and inventory problems to the user of the matched amplifier-galvanometer system.

An advantage of the separation of the impedance matching network and the amplifier from the galvanometer is that no change is required in the oscillograph itself in order to provide the desired high impedance characteristic for the amplifier-galvanometer combination; this invention provides the same advantages since the present galvanometer is of the same effective size and configuration as galvanometers heretofore provided. As a result, only minimal revision of existing expensive oscillograph instruments is necessary to enable use of the present invention. Also, after the oscillograph has been modified to accommodate the present galvanometer, the oscillograph can still be used with existing galvanometers. Moreover, conventional galvanometers and the present high impedance galvanometers can be mixed and interchanged as desired in an existing multichannel oscillograph.

Generally speaking, this invention provides a galvanometer for use in a recording oscillograph in which a graphic representation of an electrical oscillograph input signal is to be produced. The galvanometer includes a housing and a galvanometer movement mounted within the housing. The movement includes a deflection coil. Galvanometer input signal terminal means are provided to which a signal to be recorded may be applied. An amplifier is coupled between the signal input terminal means and the deflection coil. The amplifier has an output impedance of a relatively low value corresponding to a desired movement damping impedance; preferably the amplifier output impedance is in the range of from about 25 ohms to about 2,000 ohms. The amplifier has an input impedance sufficiently high that a signal generator (transducer) coupled to the input terminal means produces essentially a voltage signal.

As an output signal, the amplifier produces a current having a value proportional to the value of the signal applied to the input terminal means.

DESCRIPTION OF THE DRAWINGS

The above-mentioned and other features of this invention are more fully set forth in the following detailed description of preferred embodiments of the invention, which description is presented with reference to the accompanying drawings, wherein.

BACKGROUND PATENT LITERATURE

The details of construction and the general arrangement of optical recording oscillographs in which the present galvanometers may be used to advantage are shown in United States Patents 3,073,215, issued Jan. 15, 1963, and 3,186,000, issued May 25, 1965. A galvanometer support and magnet block with which the present galvanometers may be used is shown in United States Patent 2,904,754, issued Sept. 15, 1959. The appearance of a prior art galvanometer, over which the present galvanometer constitutes invention, is shown in United States Patent Des. 170,514, issued Sept. 29, 1953, and the construction and arrangement of prior galvanometers is shown in United States Patents 2,851,664, issued Sept. 9, 1958, 2,867,770, issued Jan. 6, 1959, 2,873,427, issued Feb. 10, 1959, and 2,886,781 issued May 12, 1959.

DESCRIPTION OF THE PREFERRED EMBODIMENTS

Figures 1, 2:
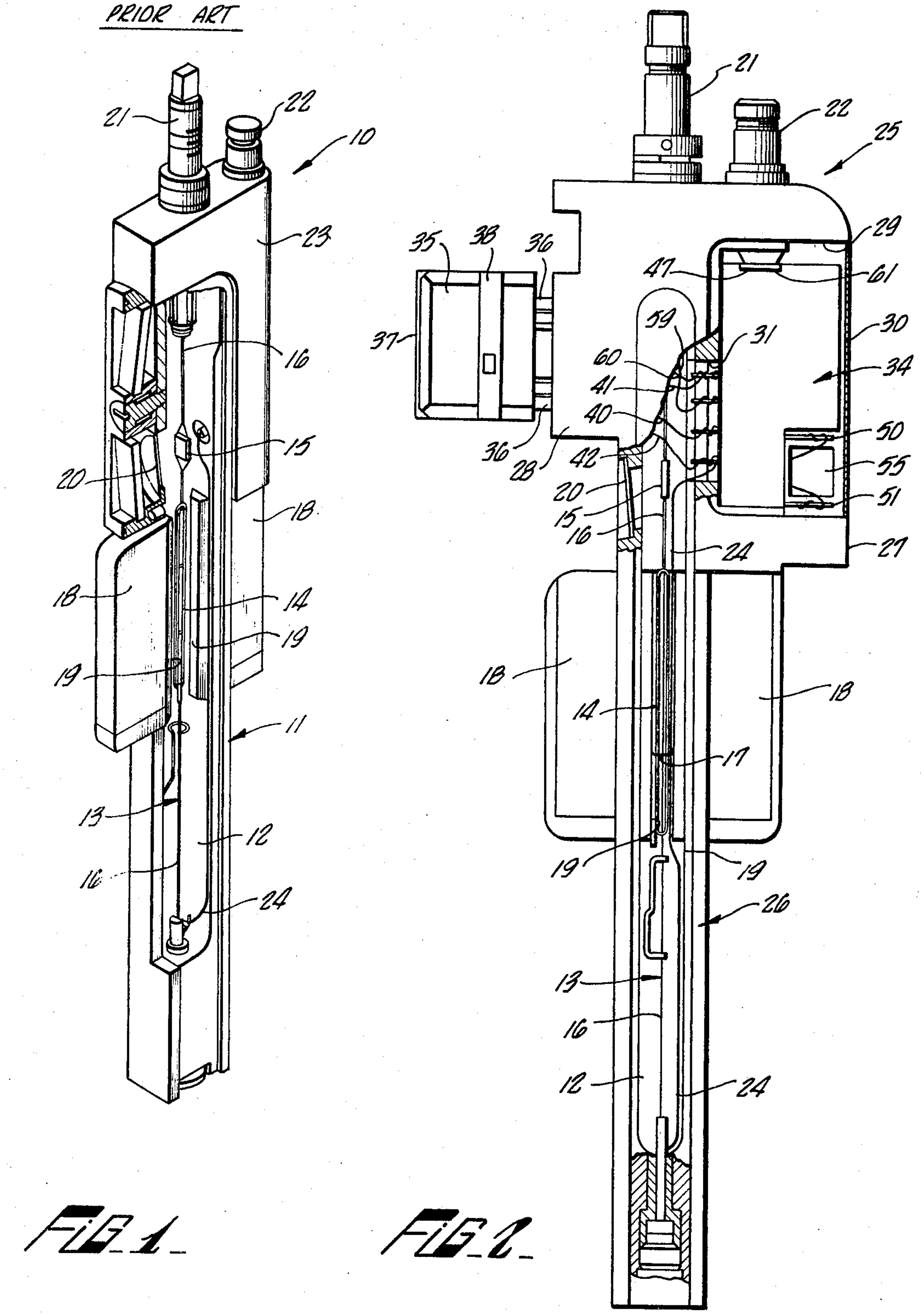
FIG. 1 is a cut-away perspective view of a prior art galvanometer.
FIG. 2 is a side elevation view, with parts broken away, of a preferred embodiment of the present galvanometer.

Referring initially to FIG. 1, and reference may also be had to United States Patents, Des. 170,514, 2,851,-644, and 2,873,427, an existing galvanometer 10 includes a rigid housing body 11 defining an elongate central cavity 12 in which is disposed a galvanometer movement 13. The movement includes a deflection coil 14 and a reflecting mirror 15 which are supported on a suspension wire 16 extending along the cavity between the ends of the body. The deflection coil is located in a gap 17 defined between a pair of magnetic pole pieces 18 which are mounted on opposite sides of the body and which extend through the body into the cavity to ends 19 disposed adjacent the coil. The mirror is disposed adjacent a window 20 in the housing through which a light beam may be directed to the mirror for reflection by the mirror to a light-sensitive recording medium. A pair of signal input terminals 21 and 22 for the galvanometer are mounted to the upper end of the body.

Input terminal 21 preferably is disposed coaxially of suspension wire 16. Terminal 22 is designated the common signal input terminal and is mounted rearwardly of terminal 21 on a rearward extension 23 of the galvanometer housing above the pole piece opposite from window 20. A conductor 24 extends from the binding post for the lower end of the suspension wire through housing extension portion 23 to common terminal 22, thereby completing a circuit between the terminals through the galvanometer coil.

Figure 6:
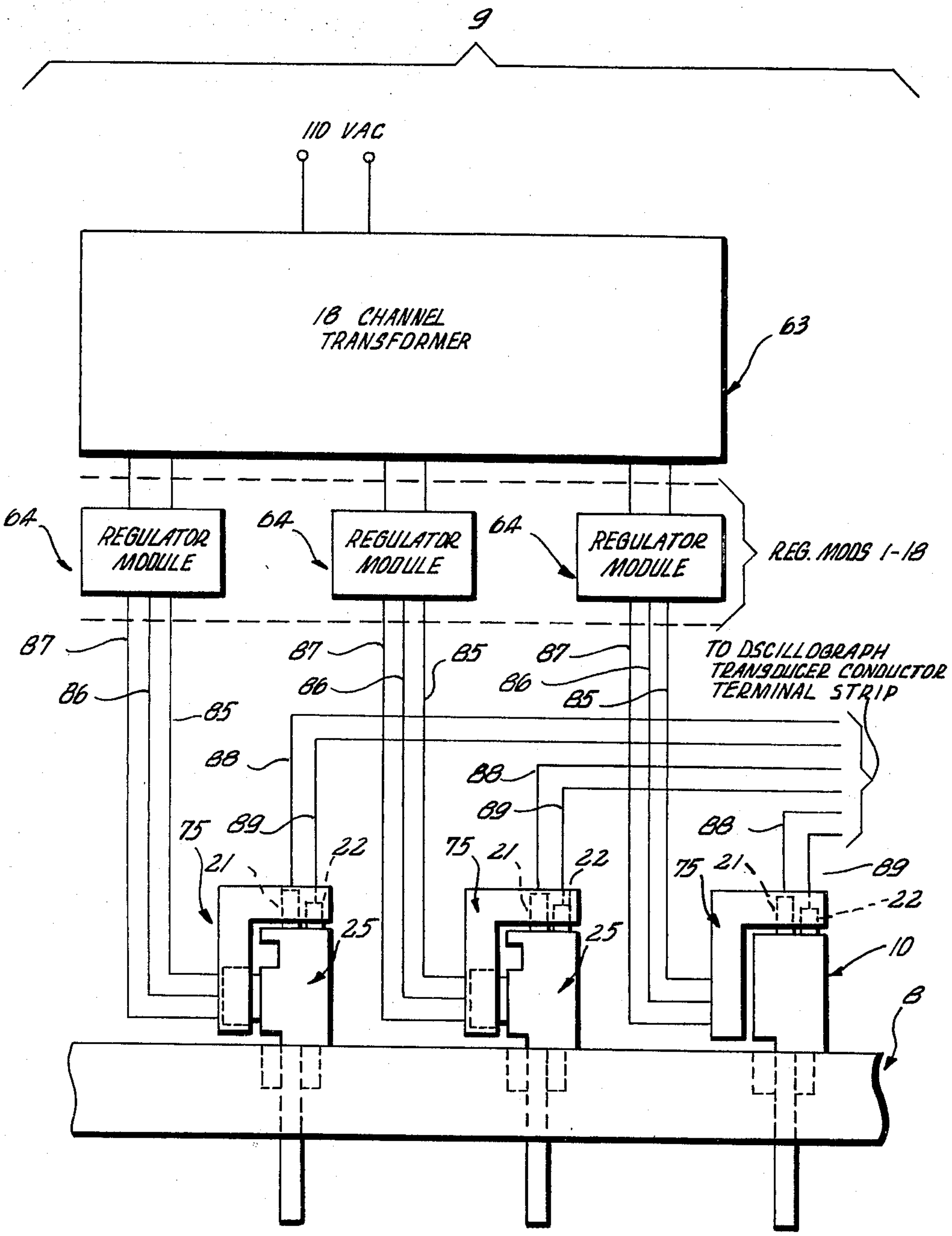
FIG. 6 is a block diagram of the signal input and energization system of an optical oscillograph incorporating the present galvanometer.

In operation, galvanometer 10 is inserted into a magnet block 8 (FIG. 6) located in an optical recording oscillograph 9 (FIG. 6). United States Patent 2,904,754 may be referred to for a description and illustration of the structure of a magnet block with which galvanometer 10 may be used. This patent also illustrates that a series of galvanometers may be placed in suitable receptacles in the magnet block in a line within the recording oscillograph. When the galvanometer is mounted in the magnet block, the pole pieces are received in the block and the portion of the galvanometer housing above the pole pieces is external of the magnet block.

FIG. 2 illustrates a galvanometer 25 according to this invention. From a comparison of the illustrations of FIGS. 1 and 2, it is apparent that galvanometer 25 is identical to galvanometer 10 from pole pieces 18 downwardly. To the extent that similar elements appear in galvanometers 10 and 25, similar reference numbers appear in FIGS. 1 and 2.

Galvanometer 25 includes a housing body 26 which, through and below pole pieces 18, is identical to housing 11. Above the pole pieces, body 26 is similar to body 11, but does incorporate an extension 27 of the housing rearwardly of the pole piece opposite from window 20; extension 27 extends farther from cavity 12 than does extension 23. Also, above the mirrow window, housing 26 defines a forward projection 28 for supporting the energization terminals of an amplifier 44 mounted within extension 27 and described below. As with galvanometer 10, galvanometer signal input terminals 21 and 22 are mounted to the upper end of the body and are of the same form and spacing as the terminals provided in galvanometer 10. Since galvanometer 25 has identical configuration to galvanometer 10 through and below pole pieces 18, it is apparent that galvanometer 25 can be inserted quite readily into the same magnet block into which galvanometer 10 is inserted during use.

The only difference between the movement of galvanometer 25 and the movement of galvanometer 10 is that in galvanometer 25 suspension wire 16 is insulatively mounted at its upper end to terminal 21, whereas in galvanometer 10 in suspension wire 16 is conductively connected to terminal 21.

A chamber 29 is provided in extension 27 and is closed by a cover plate 30 which extends from one side of the housing around the rear of the housing to the other side of the housing. Chamber 29 communicates with cavity 12 through an opening 31 formed in the body.

An amplifier circuit unit 34 is mounted in chamber 29.

A male amplifier energization terminal block 35 is mounted to body projection 2 by a pair of stand-off pins 36, as shown in FIG. 2. In elevation, the terminal block is of rectangular configuration, and in plan and front views, is relatively thin. The terminal block is mounted in the basic plane of the galvanometer. Three amplifier energization terminals 37, 38, and 39, only two of which are illustrated, are mounted to the front and to the opposite major faces of the block, respectively. Conductors 40, 41, and 42 extend from the respective terminal strips to the amplifier circuit unit through a conductor conduit 43 extending through projection 28 from the terminal block to cavity 12.

Figure 5:
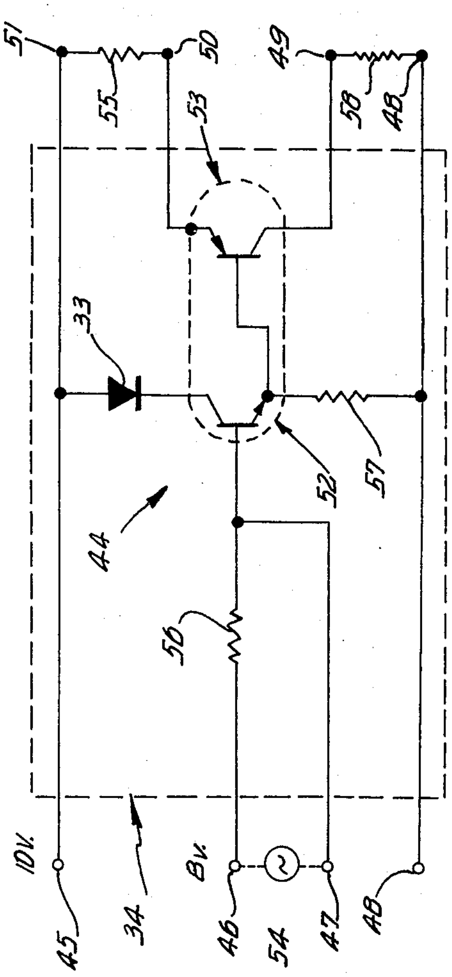
FIG. 5 is a schematic circuit diagram of the amplifier used in a preferred embodiment of the present galvanometer.

FIG. 5 is a schematic circuit diagram of an amplifier 44 which is incorporated into amplifier circuit unit 34. As shown in FIG. 5, the amplifier circuitry defines seven external terminals 45 through 51. The amplifier includes an NPN transistor 52 and a PNP transistor 53 to provide two-stage voltage-to-current inversion and amplification of a galvanometer input signal applied across terminals 46 and 47 from a signal generator 54 which may be an instrument transducer, for example. Terminal 46 is also an input terminal for the primary bias signal for the amplifier. Terminal 45 is an input terminal for a secondary bias signal for the amplifier. The galvanometer coil is connected across terminals 48 and 49, terminal 48 also being a common terminal for the amplifier energization signals. Terminals 50 and 51 are provided for connection of an amplifier trimming impedance 55 thereacross.

A bias impedance 56 is connected between terminal 46 and the base of transistor 52, terminal 47 also being connected to the base of this transistor. An impedance 57 is coupled between the emitter of transistor 52 and terminal 48. Terminal 45 is connected to the collector of transistor 52 via an overvoltage protection diode 33 and to the emitter of transistor 53 via the trimming impedance. Terminal 49 is connected to the collector of transistor 53. The emitter of transistor 52 is connected to the base of transistor 53.

Transistor 52 is a voltage-to-current inversion stage in amplifier 44 and is wired in an emitter follower input stage of the amplifier. In terms of the signal generator coupled across terminals 46 and 47, the apparent input impedance of the amplifier is at least essentially the value of bias impedance 56. The output impedance of the amplifier is defined by impedance 58 coupled in parallel across galvanometer coil terminals 48 and 49. The value of impedance 58 is selected to match the desired damping impedance of the galvanometer movement with which the amplifier is permanently paired in galvometer 25. If the galvometer movement is of the magnetically damped type, as where the galvanometer is for use with low frequency oscillograph input signals, the value of impedance 58 may be on the order of 120, 180 or 350 ohms, although for certain galvometer movements impedance 58 may have a value of as little as 25 ohms. In the case where the galvanometer movement is fluid damped, as in the case where high frequency oscillograph input signals are to be recorded, impedance 58 may be omitted. The output impedance of the amplifier is defined essentially entirely by impedance 58 since the impedance through the collector-base junction of transistor 53, relative to the galvanometer movement, can be considered as infinite. Preferably the impedance of the galvanometer movement itself is less than 100 ohms.

As explained in greater detail below, the signal developed by an instrument transducer coupled across amplifier terminals 46 and 47 is essentially a voltage which varies in value in proportion to the variations in value of a selected physical phenomenon to which the transducer is sensitive. This voltage is applied across the amplifier bias impedance either in opposition to or in addition to the primary amplifier bias voltage applied to terminal 46, depending upon whether the transducer output voltage is negative or positive. Thus, in use of the amplifier, variations in the value of the signal applied across terminals 46 and 47 produce a proportional change in the bias voltage applied to the base of transistor 52, thereby regulating the voltage drop across the base and emitter of this transistor; diode 33 is provided to prevent reverse bias across the collector base junction of the transistor should the potential applied to terminal 46 as a result of the operation of signal generator 54 exceed the potential applied to terminal 45. The base-emitter DC voltage drop in transistor 52 is equal to the base-emitter voltage drop of transistor 53 which is a current amplification stage of the amplifier; transistor 52 is a voltage-to-current inversion stage having a gain factor of essentially unity. Therefore, when a change is produced in the base-emitter voltage of transistor 52, a corresponding change is produced in the current flowing through transistor 53 and through the galvanometer coil connected across terminals 48 and 49.

As indicated in FIG. 5, a resistance 55 is coupled across amplifier circuit terminals 50 and 51 to adjust the full scale sensitivity of the galvanometer movement.

In a presently preferred embodiment of amplifier 44, the primary bias signal applied to the amplifier across terminals 46 and 48 is an 8 v. DC signal, and the secondary bias signal applied across terminals 45 and 48 is a 10 v. DC signal. In this same embodiment, impedance 56 has a value of 220K ohms and impedance 57 has a value of 6.8K ohms. In view of the foregoing, the effective amplifier input impedance presented to the transducer coupled across terminals 46 and 47 is at least 220K ohms.

It will be understood, however, by those having skill in the art to which this invention pertains that the input impedance of amplifier 44, as presented to a transducer coupled to the amplifier, can be adjusted by varying the value of impedance 56. As the value of this impedance is raised, it is apparent that the bias potentials applied to terminals 46 and 45 must be raised if the relation between the current through the galvanometer coil and the voltage developed by the transducer, i.e., galvanometer sensitivity, is to remain constant. The value of impedance 56 may have any value up to approximately 22 megohms where junction transistors are used in the first and second stages of the amplifier. If field effect transistors are used in lieu of junction transistors, then the input impedance of the amplifier as presented to the transducer may be on the order of 100 megohms. The use of field effect transistors enables the use of lower amplifier bias voltages than would be necessary if a very high input impedance were provided with a junction transistorized amplifier.

A 100 megohm input impedance is sufficiently high that even a piezoelectric accelerometer, for example, if coupled across terminals 46 and 47, would operate primarily as a voltage generator rather than a current generator. Accordingly, it is apparent that amplifier unit 34, incorporated into the housing of galvanometer 25, is capable of rendering the galvanometer effective essentially as a volt meter, rather than a current-oriented device, for substantially any type of transducer which may be coupled to the galvanometer. The galvanometer movement itself, however, remains a current-sensitive device to which the proper damping impedance is applied by the output impedance of the amplifier.

With reference to FIGS. 2 and 5, terminal 48 of the amplifier circuit unit has connected to it both return conductor 24 from the galvanometer movement and conductor 42 from energization terminal strip 37. Terminal 49 has connected to it conductor 59 which extends to coil suspension wire 16 adjacent the upper end of the galvanometer. Terminal 46 has connected to it both conductor 41 from energization terminal 39 and a conductor 60 from input terminal 21 mounted to the upper end of the galvanometer body coaxially of the galvanometer suspension. A secondary amplifier energization or bias signal is applied to terminal 45 via conductor 40 from energization terminal 38. Terminal 47 of the amplifier is defined by a conductive pad 61 disposed at the upper end of the amplifier circuit unit and engaged with the lower end of transducer signal input terminal 22, as shown in FIG. 2.

Figure 7:
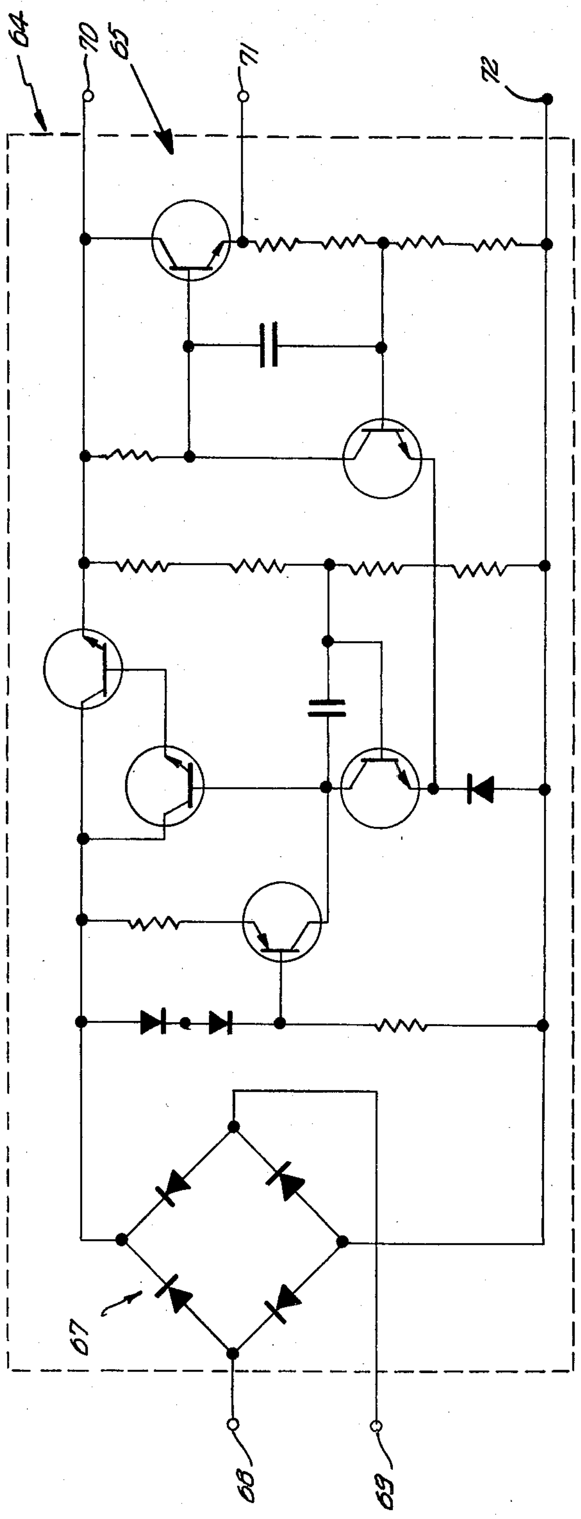
FIG. 7 is a schematic diagram of the circuitry of a regulator module shown in FIG. 6.

Galvanometer 25 may be used readily in recording oscillograph 9 designed to accommodate galvanometers of the type typified by galvanometer 10 after the oscillograph has been fitted with a retrofit kit which includes a single multichannel transformer 63 and a voltage regulator module 64 for each of galvanometers 25 used in the oscillograph. The transformer illustrated in FIG. 6 is a 18 channel transformer which may be inserted conveniently into an existing 18 channel optical recording oscillograph, it being understood that the transformer can have more or less channels as desired, depending upon the number of channels originally provided in the oscillograph. Voltage regulator modules 64 are provided for assuring that the primary and secondary DC bias signals applied to the amplifiers in galvanometers 25 are stable and essentially ripple-free. The circuitry of a suitable regulator module is illustrated in FIG. 7 and is essentially a stable power supply 65 including a full-wave rectifier bridge 67. The power supply has input terminals 68 and 69 across which the secondary of the appropriate channel of transformer 63 is connected. The power supply also has an amplifier primary bias signal output terminal 70, an amplifier secondary bias signal output terminal 71, and a common output terminal 72. In a presently preferred retrofit kit for amplifiers having the circuit values given above, the signal developed by the transformer secondary windings is an 18 v. RMS AC signal.

Figures 3, 4:
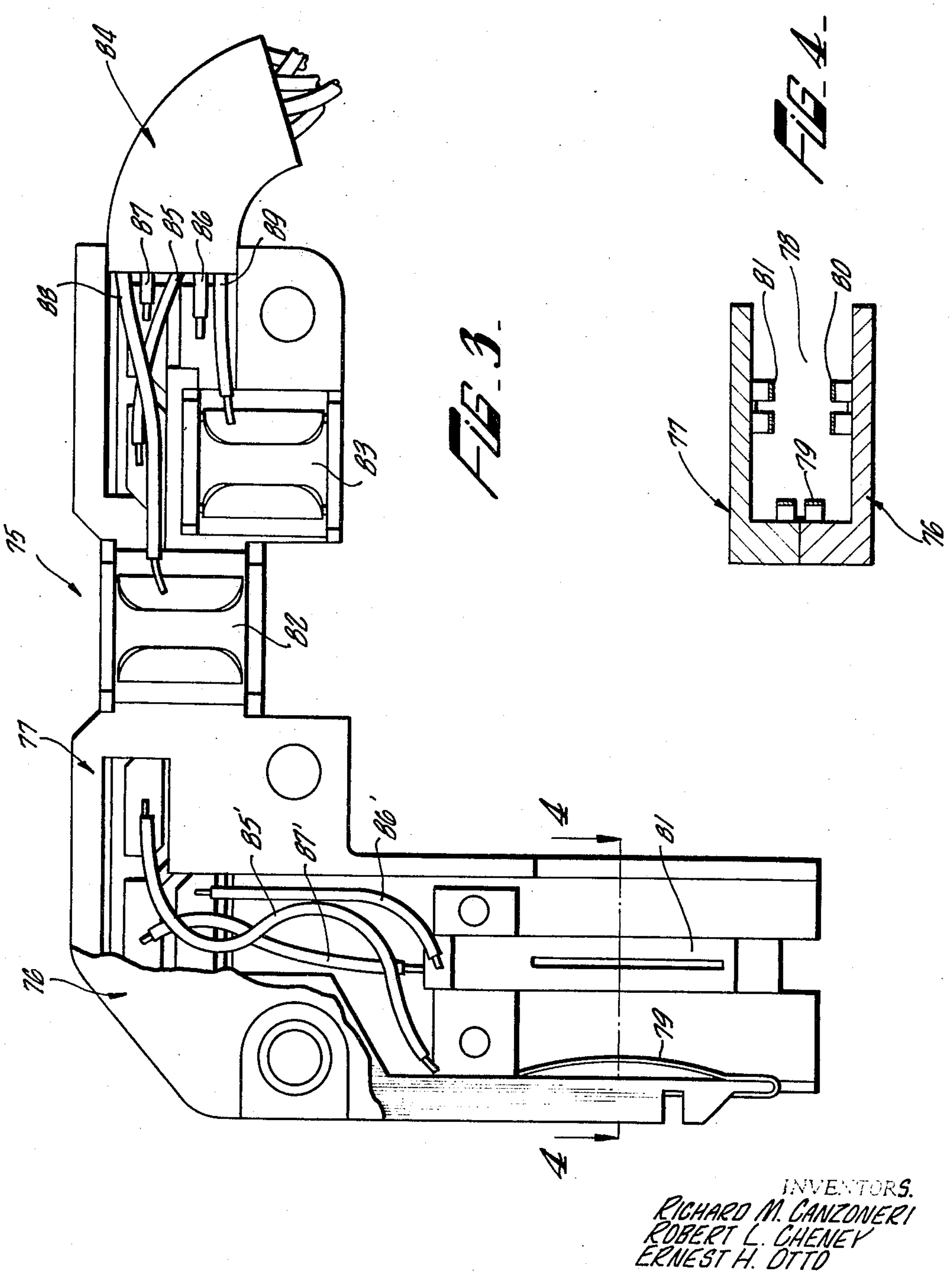
FIG. 3 is a side elevation view, with parts broken away, of a connector for use with the galvanometer shown in FIG. 2.
FIG. 4 is a section view taken along line 4—4 in FIG. 3.

The retrofit kit for galvanometer 25 also includes a 5-terminal female connector 75, shown in elevation in FIG. 3 with parts broken away, the illustration in FIG. 3 being substantially enlarged relative to the scale of FIG. 2. The connector includes a pair of mating L-shaped housing parts 76 and 77, the L being rotated 90° clockwise from an erect position for connection to a vertically disposed galvanometer 25. The housing parts cooperate to define an interior chamber 78 which is open to the bottom and to the right of the vertical leg of the connector and to the bottom of the horizontal leg of the connector, as viewed in elevation in FIG. 3, for example. Three conductive, resilient, slide-action, contact strips 79, 80, and 81 are carried by the housing parts along their vertical legs in chamber 78 at the closed end and on the opposite sides of the chamber, respectively. Contact strips 79, 80, and 81 engage terminals 37, 38, and 39, respectively, when connector 75 is engaged with galvanometer 25. If desired, however, the contact strips and the terminal members on terminal block 35 may be replaced by suitable cooperating male and female socket connector parts without departing from the scope of the invention.

Connector 75 also includes a pair of socket-type contact members 82 and 83 mounted to the horizontal leg of the connector and opening downwardly of the leg. Contact members 82 and 83 are sized to mate with galvanometer terminals 21 and 22, respectively, and are positioned relative to contact strips 79–81 so that when the connector is engaged with the galvanometer, the contact strips and the contact members engage the appropriate terminals carried by the galvanometer.

A five conductor cable 84 is connected to the connector and includes conductors 85–89. Cable conductors 85, 86, and 87 are connected within the connector to contact strips 79, 80, and 81, respectively, by conductors 85′, 86′, and 87′, respectively. At the end of the cable opposite from connector 75, cable conductors 85, 86, and 87 are connected to output terminals 70, 71, and 72, respectively, of a corresponding regulator module 65. Cable conductors 88 and 89 are connected to a corresponding pair of externally accessible binding posts (not shown) in the oscillograph to which the signal transmission cable from a desired transducer may also be connected. Thus, from the foregoing, it is apparent that connector 75 may be engaged with galvanometer 25 to engage signal input terminals 21 and 22 and connector 35. When connector 75 is so connected to the galvanometer, a primary energization signal of desired value is applied to amplifier terminal 46 from module 64, a secondary energization signal of desired value is applied to amplifier terminal 45 from the module, amplifier terminal 48 becomes a common terminal relative to the module, and amplifier terminals 46 and 47 are coupled to an appropriate instrument transducer.

Figure 8:
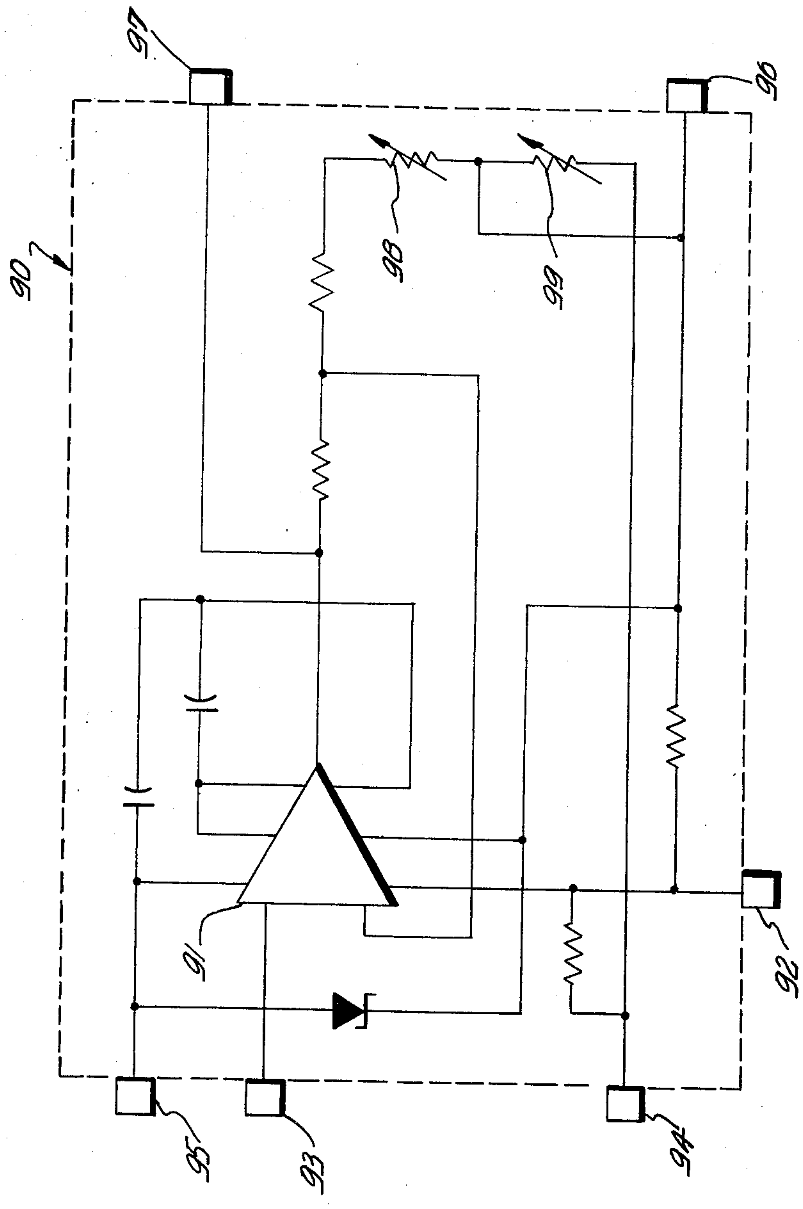
FIG. 8 is a schematic diagram of a different amplifier circuit used in another preferred embodiment of the present invention.

FIG. 8 is a schematic circuit diagram of another amplifier 90 which may be used with the embodiment of regulator module 64 described above in galvanometer 25 in place of amplifier 44. Amplifier 90 includes a miniaturized differential amplifier 91. The amplifier circuit includes terminals 92–97 of which terminal 92 is a 10 v. DC energization terminal, terminals 93 and 94 have the signal developed by the transducer applied thereacross, terminal 95 is a common terminal relative to the regulator module, and the galvanometer coil is coupled across terminals 96 and 97. The amplifier also includes a gain adjust impedance 98 and a zero or reference axis adjust impedance 99. The 8 v. DC signal from the regulator module is not used with amplifier 90, and thus where galvanometer 25 includes such amplifier, conductor 41 is not provided.

In a presently preferred embodiment of amplifier 90, differential amplified 91 is defined by a Texas Instruments SN 526 solid state circuit. The input impedance of the amplifier presented to a transducer coupled across terminals 93 and 94 is on the order of 1 megohm.

Like amplifier 44, amplifier 90, when coupled to a transducer, receives the transducer signal as a voltage, because of the high input impedance of the amplifier, and supplies a current of proportional value to the galvanometer coil.

Galvanometer 25, regardless of which of the above-mentioned amplifiers is incorporated therein, may be used interchangeably with galvanometer 10 in an oscillograph equipped with a retrofit kit in accord with the foregoing description, as shown in FIG. 6. As noted above, conductors 88 and 89 from each connector 75 extend to a corresponding pair of transducer cable binding posts or the like. If a given connector 75 is connected to a galvanometer 25, the transducer signals and the galvanometer amplifier energization signals are applied to the appropriate terminals of the galvanometer. If the same connector is connected to a galvanometer 10, the transducer signals are still applied to galvanometer terminals 21 and 22; in such a case contacts 79–81 of the connector have nothing to engage on the galvanometer and so their presence is of no effect.

Figure 9:
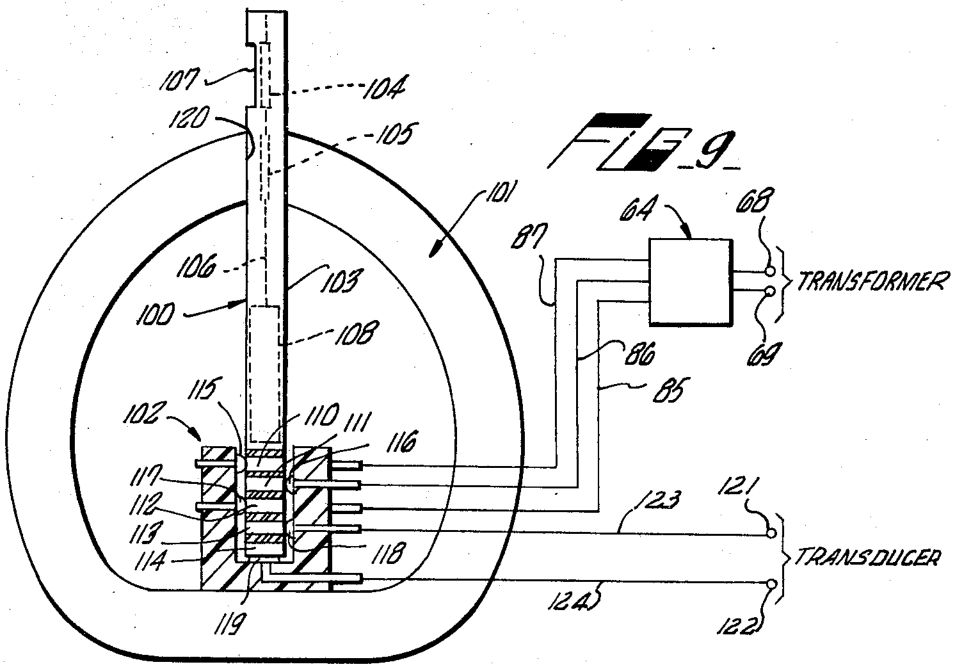
FIG. 9 is an elevation view, partially in cross-section, of a pencil-type galvanometer according to this invention disposed in a cooperating magnet block.

Referring now to FIG. 9, and reference may also be had to U.S. Patents 2,867,770 and 2,886,781, a pencil galvanometer 100 is shown mounted in a magnet block 101 within a recording oscillograph so that the lower end of the galvanometer engages a connector assembly 102 mounted to the magnet block. The galvanometer has a hollow essentially cylindrical elongate housing 103 within which are disposed a mirror 104 and a deflection coil 105 mounted on a galvanometer movement suspension wire 106 extending essentially axially of the housing, the mirror being located adjacent a window 107 through the housing. Unlike a conventional pencil galvanometer which is fitted with two connection terminals for cooperation with a two-contact connector assembly, the lower end of galvanometer 100 is fitted with five connection terminals 110–114 which are insulated from each other and from the galvanometer housing; if desired, however, the galvanometer housing can be used as one of terminals 110–114. An amplifier 108 is disposed within the galvanometer housing. Connector assembly 102 includes five contact members 115–119 for cooperation with respective ones of terminals 110–114.

Magnet block 101, in elevation, has a configuration akin to that of a horseshoe magnet. In a multichannel oscillograph the magnet block is elongated to accommodate a plurality of pencil galvanometers. The magnet block and the galvanometer are cooperatively configured so that when the lower end of the galvanometer is engaged in the connector assembly, the deflection coil of the galvanometer movement is disposed in a gap 120 of the magnet block and window 107 is disposed above the block.

Amplifier 108 may be like amplifier 44 described above. In such case, the primary bias, secondary bias and common terminals of amplifier 44 are connected within the galvanometer housing to terminals 110, 111, and 112, whereas amplifier terminals 48 and 49 are connected to galvanometer terminals 113 and 114. Contact members 116, 117, and 118 are connected via conductors 85–87 to the primary and secondary bias and the common terminals of a regulator module 64, the regulator module being connected to corresponding secondary taps of a suitabl transformer like transformer 63. The output of a suitable transducer may be applied to the amplifier within the galvanometer housing from terminals 121 and 122 of a transducer connection panel via conductors 123 and 124 and contact members 118 and 119. Within the galvanometer housing the output of the amplifier is coupled across deflection coil 105.

As described above, amplifier 108 has an output impedance which is the proper damping impedance for the galvanometer movement. The amplifier also has a sufficiently high input impedance that a transducer connected across terminals 121, 122 functions primarily as a voltage source rather than as a current source. The amplifier defines the desired voltage sensitivity and full scale sensitivity characteristics of the galvanometer.

The structure illustrated in FIG. 9 is compatible with existing two-terminal pencil galvanometers which may be used interchangeably with galvanometer 100. If an existing conventional galvanometer is inserted into the magnet block, contact members 115–117 have no terminals on the galvanometer with which to cooperate, with the result that the regulator module is unused. The transducer output signal is applied directly across the deflection coil because of the internal wiring of the galvanometer.

The structure of the oscillograph with which galvanometer 100 is used differs from oscillographs existing at this time by the inclusion of the necessary regulator modules and transformer, and by the presence of five, rather than two, contact connector assemblies in each channel in which a high impedance galvanometer may be used. It may be a difficult task to substitute a five-contact connector assembly for a two-contact assembly in the magnet block of an oscillograph suitable for use with pencil galvanometers. Accordingly, the structure shown in FIG. 10 may, in some cases, be preferred to the structure shown in FIG. 9.

Figure 10:
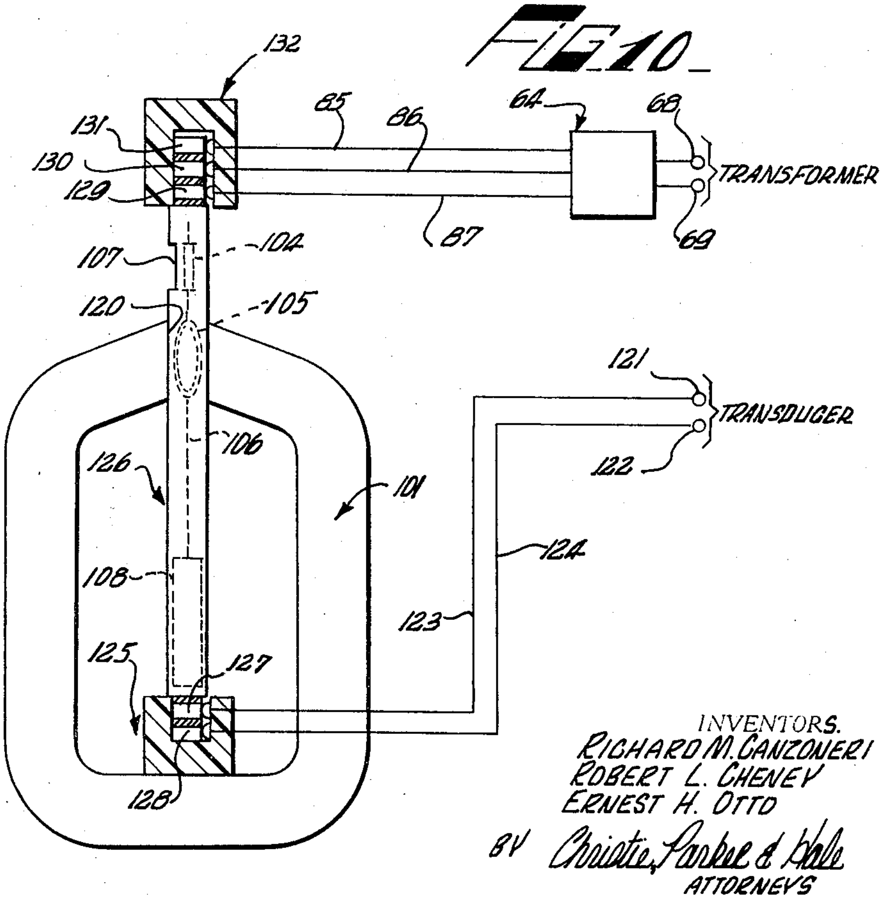
FIG. 10 is an elevation view similar to that of FIG. 9 showing another pencil-type galvanometer according to this invention.

As shown in FIG. 10, the conventional two-contact connector assembly 125 normally disposed at the base of magnet block 101 is retained. Galvanometer 126 differs from galvanometer 100 only to the extent that it defines two lower terminals 127 and 128 across which a transducer output signal may be applied, and it defines three upper terminals 129, 130 and 131 which cooperate with corresponding contacts of a connector assembly 132 for connection to the primary and secondary bias and common terminals of a regulator module 64. Amplifier 108 within the galvanometer housing preferably is in accord with the foregoing description concerning amplifier 34, and terminals 127–131 are connected within the galvanometer housing to amplifier terminals 45–48. The amplifier output is applied across the galvanometer movement as described above.

Conventional galvanometers and galvanometers in accord with this invention may be interchanged readily in the structure depicted in FIG. 10. Where conventional galvanometers are used, connector assemblies 132 are merely left unconnected to the corresponding galvanometers which are not configured to receive the connector assemblies.

It will be understood that an amplifier of the type illustrated in FIG. 8 may be utilized as amplifier 108 in either of galvanometers 100 or 126 without departing from the scope of this invention.

Figure 11:
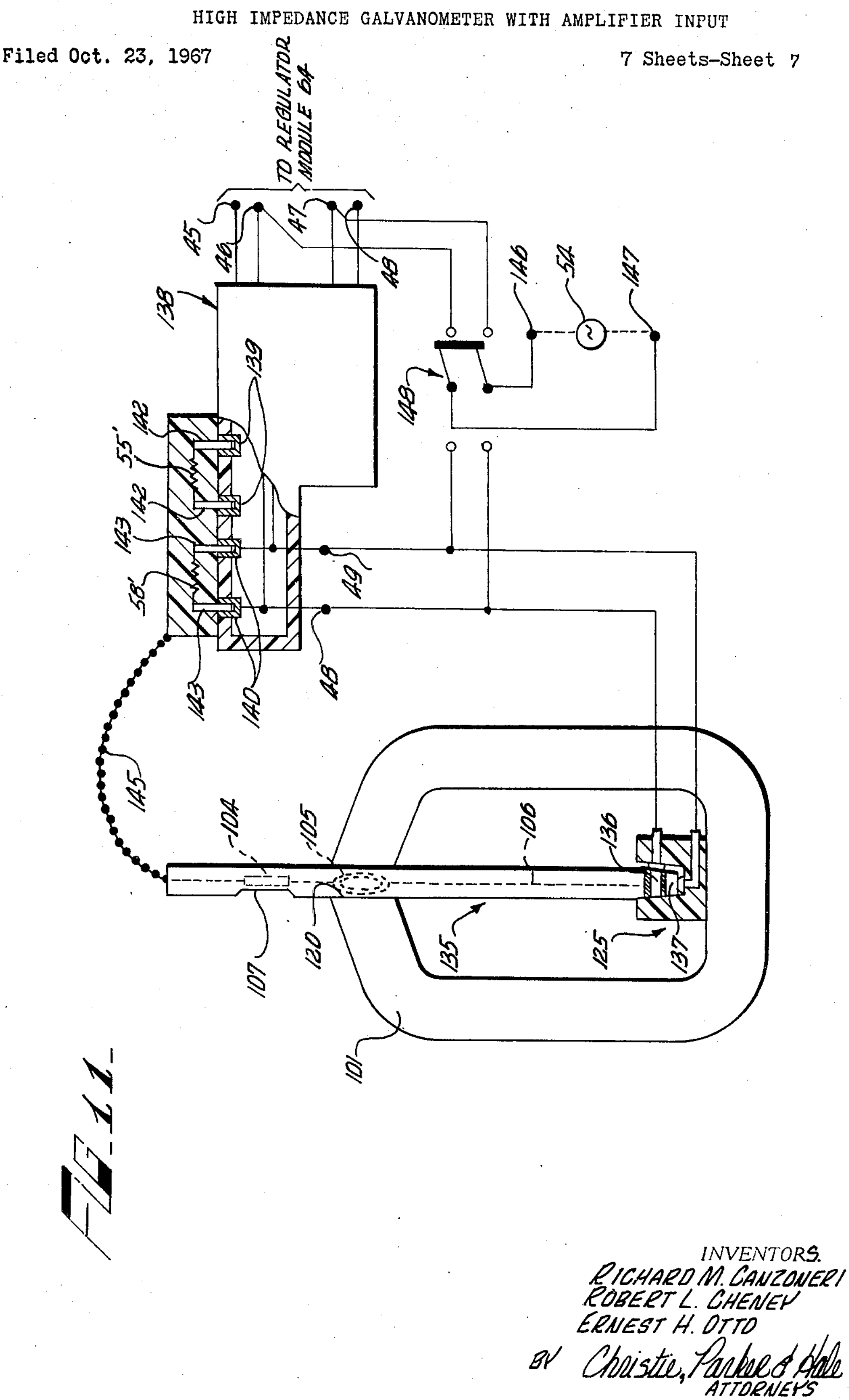
FIG. 11 is an elevation view of another embodiment of the invention, utilizing a pencil-type galvanometer for illustrative purposes, in which the amplifier is located external to the galvanometer housing.

In the event that the circuitry of amplifiers 34 or 90, or any other suitable amplifier circuit, cannot conveniently be located within the housing of a galvanometer, particularly a pencil galvanometer, without so altering the configuration of the galvanometer as to require substantial change in the appropriate oscillograph (thereby making it difficult or impossible to interchange existing galvanometers and galvanometers in accord with this invention), the embodiment shown in FIG. 11 may be used to advantage.

With reference to FIG. 11, galvanometer 135 is constructed like an existing pencil galvanometer and has two terminals 136 and 137 at its lower end for cooperation with a conventional connector assembly 125. The galvanometer is provided in combination with an amplifier unit 138 which is located in an oscillograph external to the galvanometer housing adjacent the position which the galvanometer occupies in magnet block 101. The amplifier unit includes an amplifier circuit which is similar to amplifier circuit 44 described above, but which differs from circuit 44 in that impedances 55 and 58 of circuit 44 are not present, but are replaced by corresponding pairs of socket-like connector elements 139 and 140, rerespectively, in a face of the amplifier unit. Counterparts of impedances 55 and 58 of circuit 44 are provided by impedances 55' and 58' which are mounted in a plug-in block 141 and which are connected in the block between corresponding pairs of connector pins 142 and 143. Pins 142 and 143 are arranged to engage connector elements 139 and 140, respectively, of the amplifier unit when the plug-in block is engaged with the amplifier unit as shown. The plug-in block is permanently mechanically connected to the galvanometer by a length of chain or woven wire cable 145.

Each amplifier unit 138 provided is constructed to a reasonably high level of accuracy in terms of its input-output characteristics. The values of impedances 55' and 58' are selected with reference to the characteristics of the movement of the particular galvanometer with which they are associated so that the galvanometer, when coupled to the amplifier unit via the plug-in block, has voltage sensitivity and full scale sensitivity characteristics within the desired limits.

Amplifier unit 138, particularly terminals 46 and 47 thereof, is connected either in series with transducer output connection terminals 146 and 147 relative to the galvanometer or out of a circuit between terminals 146 and 147 to the terminals of connector assembly 125, depending upon the state of a DPDT switch 148. When a galvantometer fitted with a plug-in block is being used, the switch is disposed so that the output of a transducer 54 coupled between terminals 146, 147 is applied to terminals 46 and 47 of the amplifier unit. When a conventional galvanometer is being used, the switch is disposed in its other operative state to apply the transducer output signal directly across the galvanometer movement. To assure that switch 148 is in the proper position when a galvanometer equipped with a plug-in unit is used in the oscillograph, the switch may be provided as a microswitch mounted on the structure of the amplifier unit adjacent the engaged position of the plug-in unit with the amplifier unit, the switch then being responsive to the presence of the plug-in unit with the receptacle defined by the amplifier unit to connect the amplifier in circuit between terminals 146, 147 and the connector assembly for the galvanometer.

It will be understood that amplifier unit 138 can incorporate an amplifier circuit similar to circuit 90 in which impedances 98 and 99 are defined in the plug-in block for a particular galvanometer, and that such alternative is within the scope of this invention.

As an alternative to the arrangement shown in FIG. 11, the entire circuitry of the amplifier unit, including impedances 55' and 58' could be defined in a member chained or otherwise permanently mechanically matched to the galvanometer and adapted for plug-in connection to a suitable connector wired to the output of a regulator module 64.

The embodiment illustrated in FIG. 11 is not the most preferred embodiment of this invention since the use of such embodiment requires an extensive reworking of an existing oscillograph, and since the amplifier units must be fabricated to reasonably high, and thus costly, standards of accuracy and precision. The embodiment of FIG. 11, however, is preferred over an arrangement in which there is no mechanical connection between the galvanometer and the amplifier unit or any part thereof; in such case, both the galvanometer and the amplifier unit must be fabricated to narrow limits of precision, and such an approach presents the logistics and inventory problems noted above.

From the foregoing, it is apparent that this invention provides an improved and novel galvanometer having all the features recited for it above. Because of the marriage to the galvanometer of an amplifier in accord with the foregoing description, the amplifier has a high input impedance coupled to the output terminals of an instrument transducer. The input impedance of the galvanometer is so high that the transducer functions as a voltage generator; this is the case even where the transducer may normally be of the current type such as a strain gage transducer in which a plurality of strain gages are arranged in a Wheatstone bridge configuration. The impedance of the galvanometer may be made sufficiently high that even a piezoelectric accelerometer, for example, functions as a voltage generator rather than a current generator. Notwithstanding the high input impedance of the galvanometer amplifier, the output impedance of the amplifier can be readily matched to the desired damping impedance for the galvanometer movement. Accordingly, the galvanometer need not be paired directly with a particular type of instrument transducer, nor is an impedance matching network or an external voltage-to-current conversion amplifier required. Because the amplifier preferably is located directly within the galvanometer housing, the above-described problems of keeping track of the particular amplifier for a particular galvanometer are eliminated.

Also, the galvanometer can be made with a very high rated accuracy at relatively low cost since, in view of the permanent marriage between the galvanometer movement and the amplifier, the output impedance of the amplifier can be adjusted quite readily to the desired galvanometer movement damping impedance at the time the amplifier is assembled in the galvanometer housing. The retrofit kit described above is extremely simple and can be installed readily by a normal oscillograph service technician into an existing oscillograph. Thereafter, the galvanometer described above can be used interchangeably with existing galvanometers, thereby providing an extremely versatile and flexible recording oscillograph.

While the invention has been described above with reference to specific structure and circuit arrangements, this description has been presented merely in furtherance of the presentation of presently preferred embodiments of this invention. The foregoing description should not, therefore, be considered as limiting the scope of this invention.

What is claimed is:

1. In combination, a galvanometer for use in a recording oscillograph wherein are produced graphic representations of unidirectional or bidirectional electrical oscillograph input signals supplied from a signal source, the galvanometer comprising a housing and a movement mounted in the housing, galvanometer signal input terminal means to which a signal to be recorded may be applied, amplifier means coupled between the signal input terminal means and the movement and having (a) an output circuit defining (1) an output impedance corresponding to a desired damping impedance for the galvanometer movement, and (2) means for imparting a desired sensitivity characteristic to the movement, and (b) an input impedance sufficiently high that a signal source producing a signal applied to the galvanometer signal input terminal means produces such signal essentially as a voltage, the amplifier means producing as an output thereof a current of value proportional to the value of a voltage signal applied to said input terminal means, and means mechanically coupling to the galvanometer housing at least that portion of the amplifier means output circuit which defines the means for imparting the desired sensitivity characteristic.

2. The combination according to claim 1 wherein the input terminal means are disposed remote from the galvanometer housing, said portion of the amplifier means is less than the whole of the amplifier means, the remainder of the amplifier means being disposed external to and separate from the galvanometer housing.

3. The combination according to claim 1 wherein said portion of the amplifier means is disposed external to the galvanometer housing and is mechanically coupled to the housing so as to be substantially inseparable therefrom.

4. The combination according to claim 1 wherein the galvanometer signal input terminal means are mounted to the galvanometer housing.

5. The combination according to claim 1 wherein the amplifier means output impedance is selected in the range of from about 25 ohms to about 2,000 ohms.

6. The combination according to claim 1 wherein the input impedance of the amplifier means is at least about 100,000 ohms.

7. The combination according to claim 1 wherein said portion of the amplifier means output circuit includes means defining said output impedance.

8. An improved galvanometer for use in a recording oscillograph wherein graphic representations of electrical oscillograph input signals are produced, the galvanometer comprising a housing, a galvanometer movement including a deflection coil mounted in the housing, a pair of galvanometer signal input terminals mounted to the housing across which a signal to be recorded may be applied, circuit means within the housing coupled between the signal input terminals and the coil and including an amplifier having an output impedance of relatively low value corresponding to a desired movement damping impedance and having an input impedance substantially higher than the output impedance, the amplifier producing as an output thereof a current of value proportional to the value of a signal applied across said input terminals, and amplifier energization terminal means mounted to the housing and coupled to the amplifier by the circuit means.

9. An improved galvanometer according to claim 8 wherein the amplifier has an input impedance of at least about 100,000 ohms.

10. An improved galvanometer according to claim 8 wherein the amplifier includes a voltage-to-current inversion first stage and a current amplification second stage.

11. An improved galvanometer according to claim 8 wherein the amplifier includes a differential amplifier circuit.

12. An improved galvanometer according to claim 8 wherein the signal input terminals of the improved galvanometer are disposed on the housing at positions corresponding to the location of a pair of input terminals on a prior art galvanometer having an exterior configuration similar to that of said improved galvanometer, and including a source of energization signals for the amplifier of said improved galvanometer, and connector means for coupling the source to said galvanometer amplifier energization terminal means, the connector means including a pair of contact members for the galvanometer signal input terminals of said improved galvanometer adapted to be connected to a source of signals of which graphic representations are to be produced, the connector means being arranged to mate with both the input terminals of said prior art galvanometer as well as with the amplifier energization terminal means and the pair of terminals of said improved galvanometer.

13. An improved galvanometer according to claim 12 wherein the connector means includes a first part for engaging the amplifier energization terminal means of said improved galvanometer and a second part for engaging the signal input terminals of said improved galvanometer.

14. An improved galvanometer according to claim 8 including a male connector member mounted to the housing and supporting the energization terminal means, a source of energization signals for the amplifier, a female connector including contact members for said pair of terminals and for the energization terminal means, means connecting the contact members for the energization terminal means to said source, and means for connecting the contact members for said pair of terminals to a source of signals of which graphic representations are to be produced.

15. Modifying apparatus for a recording oscillograph including a galvanometer adapted to be mounted in the oscillograph and including a movement requiring a characteristic damping impedance, an amplifier adapted to be mounted to the oscillograph and having an output impedance of value corresponding to said movement damping impedance and an input impedance sufficiently high that a generator of signals to be recorded in the oscillograph produces essentially voltage signals when coupled to the amplifier, means for coupling the amplifier output to the galvanometer movement, means essentially permanently coupling to the galvanometer that portion of the amplifier defining said output impedance, and a power supply for the amplifier adapted to be mounted to the oscillograph for applying amplifier energization signals of desired level and character to the amplifier.

16. Apparatus according to claim 15 wherein the galvanometer defines input terminal means to which a signal to be recorded may be applied, the amplifier is connected between said terminal means and the galvanometer movement and is mechanically coupled to the galvanometer.

17. Apparatus according to claim 16 wherein the amplifier is disposed in the galvanometer, the galvanometer includes energization terminal means for the amplifier, and connector means for coupling the galvanometer input terminal means to a source of signals to be recorded and for coupling the energization terminal means to the power supply.

18. Apparatus according to claim 15 wherein the modifying apparatus is suited for use in a multichannel oscillograph and includes a plurality of said galvanometers, an amplifier for each galvanometer, and a power supply for each amplifier.

19. Apparatus according to claim 18 including a multichannel transformer for supplying energizing power to each of the power supplies and adapted to be mounted to the oscillograph.

20. A recording oscillograph including a plurality of galvanometers for producing graphic representations of variations of oscillograph input signals applied to the galvanometers, each galvanometer having a housing and including input signal terminal means mounted to the housing to which may be applied oscillograph input signals and a movement in the housing having a characteristic damping impedance, at least one of the galvanometers having the movement thereof coupled substantially directly across the input terminal means thereof, at least one different galvanometer of said plurality having a corresponding amplifier within the housing coupled between the input terminal means and the movement thereof, the amplifier having an output impedance corresponding to the characteristic damping impedance of the movement of said different galvanometer and having an input impedance sufficiently high that a generator of oscillograph input signals coupled to the input terminal means of said different galvanometer generates said signals essentially as voltages, and means coupled to the amplifier for energizing the amplifier.

21. An oscillograph according to claim 20 including a power supply for each amplifier, and a common power source for the power supplies.

22. An oscillograph according to claim 20 including a corresponding plurality of identical connectors for the galvanometers and their corresponding amplifiers where present, each connector being connected to said amplifier energizing means and to coupling means for a source of oscillograph input signals.

23. An oscillograph according to claim 22 wherein the galvanometers are of the pencil type, the oscillograph includes a magnet block in which the galvanometers are disposed during operation of the oscillograph, and said connectors are disposed along and within the magnet block.

24. An oscillograph according to claim 20 wherein the galvanometers are of the pencil type having opposite terminal ends, the oscillograph includes a magnet block in which the galvanometers are disposed during operation of the oscillograph so that one end of each galvanometer is disposed within the magnet block and the other end of each galvanometer is disposed outside the block, the oscillograph input signal terminal means being disposed at said one end of the galvanometers, a corresponding plurality of identical connectors disposed within the magnet block for cooperation with said one end of the galvanometers for coupling the galvanometers to respective sources of oscillograph input signals, the different galvanometer includes amplifier energization terminal means at the other end thereof, and a connector for the different galvanometer arranged for cooperation with the other end thereof for coupling the different galvanometer to the amplifier energizing means.

25. A recording oscillograph including a pencil-type galvanometer having a housing incorporating a movement and terminal means connected within the housing to the movement and by which movement driving signals are applied to the galvanometer, the movement having a characteristic damping impedance requirement, a magnet block for supporting the galvanometer during operation of the oscillograph and including connector means cooperating with the galvanometer terminal means, oscillograph input signal terminal means to which a source of signals to be recorded may be connected, an amplifier circuit disposed external to the galvanometer housing and the magnet block and having input, output and energization terminal means, the amplifier circuit having an input impedance sufficiently high that a source of signals to be recorded coupled to the input terminals thereof operates essentially as a voltage generator, the amplifier having an output impedance meeting the characteristic damping impedance requirement of the galvanometer movement, at least a portion of the amplifier circuit being disposed in a plug-in module mechanically linked to the galvanometer housing so as to be essentially inseparable therefrom, receptacle means adjacent the operative position of the galvanometer in the magnet block for operatively receiving the plug-in module, energization means for the amplifier circuit, and means for coupling the energization means to the energization terminal means of the amplifier circuit, for coupling the oscillograph input signal terminal means to the amplifier circuit input terminal means, and for coupling the amplifier output terminal means to the connector means.

26. An oscillograph according to claim 25 wherein the plug-in module defines a fractional portion of the amplifier circuit, said fractional portion of the amplifier circuit defining the output impedance of the amplifier circuit, and the remainder of the amplifier circuit includes said receptacle means.

27. An oscillograph according to claim 26 including switch means connected between the oscillograph input signal terminal means, the connector means and the amplifier input terminal means operable for selectively connecting the amplifier circuit in a circuit between the oscillograph input signal terminal means and the connector means.

28. An oscillograph according to claim 27 wherein the switch means is disposed relative to the receptacle means to be responsive to engagement of the plug-in module with the receptacle means to connect the amplifier circuit in a circuit between the oscillograph input signal terminal means and the connector means.

References Cited

UNITED STATES PATENTS

| | | | |
|---|---|---|---|
| 2,892,154 | 6/1959 | Johnson | 324—154 X |
| 3,007,112 | 10/1961 | Taylor | 324—123 X |

OTHER REFERENCES

Michels: Electrical Measurements and Their Applications, 4th ed. (1961), pp. 26–27.

Malmstadt and Enke: Electronics for Scientists (1963), pp. 185–189.

ALFRED E. SMITH, Primary Examiner

U.S. Cl. X.R.

324—123, 125; 346—109

PO-1050
(5/69)

UNITED STATES PATENT OFFICE
CERTIFICATE OF CORRECTION

Patent No. 3,509,459 Dated April 28, 1970

Inventor(s) Richard M. Canzoneri, Robert L. Cheney and Ernest H. Otto

It is certified that error appears in the above-identified patent and that said Letters Patent are hereby corrected as shown below:

In Column 1, line 61, for "pecific" read --specific--.

In Column 3, line 1, for "sensitive" read --sensitivity--;

line 4, for "separated" read --separate--.

In Column 4, line 44, for "644" read --664--.

In Column 5, line 47, for "2" read --28--.

In Column 6, line 26, for "galvometer" read --galvanometer--.

In Column 9, line 67, for "suitabl" read --suitable--.

SIGNED AND SEALED

SEP 29 1970

(SEAL)
Attest:

Edward M. Fletcher, Jr.
Attesting Officer

WILLIAM E. SCHUYLER, JR.
Commissioner of Patents